(12) United States Patent
Beesley et al.

(10) Patent No.: US 12,035,466 B2
(45) Date of Patent: Jul. 9, 2024

(54) SYSTEMS AND METHODS FOR MANUFACTURING THIN SUBSTRATE

(71) Applicant: Apple Inc., Cupertino, CA (US)

(72) Inventors: Mark J. Beesley, Carmel Valley, CA (US); Meng Chi Lee, Los Altos, CA (US); Nima Shahidi, San Francisco, CA (US); Hao Shi, Mountain View, CA (US); Quan Qi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 63 days.

(21) Appl. No.: 17/236,883

(22) Filed: Apr. 21, 2021

(65) Prior Publication Data

US 2022/0104346 A1 Mar. 31, 2022

Related U.S. Application Data

(60) Provisional application No. 63/083,675, filed on Sep. 25, 2020.

(51) Int. Cl.
*H05K 1/02* (2006.01)
*H05K 1/03* (2006.01)
(Continued)

(52) U.S. Cl.
CPC ......... *H05K 1/0298* (2013.01); *H05K 1/0313* (2013.01); *H05K 1/05* (2013.01); *H05K 1/09* (2013.01); *H05K 1/11* (2013.01)

(58) Field of Classification Search
CPC ...... H05K 1/0298; H05K 1/0313; H05K 1/05; H05K 1/09; H05K 1/024; H05K 3/103; H05K 1/056; H05K 2201/0376
See application file for complete search history.

(56) References Cited

U.S. PATENT DOCUMENTS 5,153,050 A * 10/1992 Johnston .............. H05K 3/4611
428/209
5,167,997 A * 12/1992 Chamberlain .......... B32B 37/00
156/60

(Continued)

OTHER PUBLICATIONS

Lee et al., "Fabrication and characterization of embedded capacitors in printed circuit boards using b-stage epoxy/BaTiO3 composite embedded capacitor films (ECFs)," 2008 58th Electronic Components and Technology Conference, May 27-30, 2008, Lake Buena Vista, FL, USA; IEEE, Piscataway, NJ, USA; pp. 742-746.

*Primary Examiner* — Ishwarbhai B Patel
(74) *Attorney, Agent, or Firm* — Fletcher Yoder, P.C.

(57) ABSTRACT

Printed circuit boards (PCB) used to mechanically and electrically connect electrical components within an electronic device. Thin printed circuit boards (PCB) may be desirable to manufacturers and users of electronic devices. Accordingly, a process for manufacturing a printed circuit board may involve manufacturing a thin bilayer dielectric. The process may involve applying a first non-conductive layer to a metal substrate, and curing the first non-conductive layer to a C-stage resin layer that is fully cross-linked layer in a clean environment. In turn, a B-stage layer that is partially cured may be applied to the C-stage resin layer. Using a hot press, one or more metal traces may be pressed onto the B-stage layer. The B-stage resin layer may be fully cross-linked and integrated with the C-stage resin layer after lamination of the one or more metal traces and the B-stage resin layer.

29 Claims, 5 Drawing Sheets

(51) Int. Cl.
    *H05K 1/05*     (2006.01)
    *H05K 1/09*     (2006.01)
    *H05K 1/11*     (2006.01)

(56) References Cited

U.S. PATENT DOCUMENTS

| | | | |
|---|---|---|---|
| 5,232,548 A * | 8/1993 | Ehrenberg | H05K 3/462 |
| | | | 428/209 |
| 5,718,789 A * | 2/1998 | Gebhardt | H05K 3/045 |
| | | | 156/154 |
| 6,268,070 B1 * | 7/2001 | Bergstresser | H05K 3/4652 |
| | | | 428/209 |
| 7,017,265 B2 | 3/2006 | Tani et al. | |
| 2002/0061415 A1 * | 5/2002 | Steiner | H05K 3/025 |
| | | | 428/209 |
| 2003/0127187 A1 * | 7/2003 | Rapuano | B32B 37/26 |
| | | | 156/308.2 |
| 2009/0241332 A1 * | 10/2009 | Lauffer | H05K 3/462 |
| | | | 29/829 |
| 2014/0246227 A1 | 9/2014 | Lin et al. | |
| 2019/0223285 A1 | 7/2019 | Sivano De Sousa et al. | |
| 2020/0053887 A1 * | 2/2020 | Bund | H05K 1/0271 |

* cited by examiner

SYSTEMS AND METHODS FOR MANUFACTURING THIN SUBSTRATE

CROSS REFERENCE TO RELATED APPLICATIONS

This application claims priority from and the benefit of U.S. Provisional Application Ser. No. 63/083,675, entitled "SYSTEMS AND METHODS FOR MANUFACTURING THIN SUBSTRATE," filed Sep. 25, 2020, which is hereby incorporated by reference in its entirety for all purposes.

BACKGROUND

The present disclosure relates generally to a lamination process and, more particularly, to efficiently manufacturing layers of a printed circuit board (PCB).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Multi-layered boards such as printed circuit boards (PCBs) are used to mechanically support and electrically connect electrical components within electronic devices. For example, such electronic devices may include computers, mobile phones, portable media devices, tablets, televisions, virtual-reality headsets, and vehicle dashboards, among many others. Printed circuit boards (PCBs) may include many metal and dielectric layers. For example, a dielectric layer may be disposed between two metal layers. A dielectric layer composed of fiber glass and resin may be disposed between the two metal layers to prevent layer to layer shorts within the printed circuit board (PCB). It is now recognized that manufacturing a thin dielectric layer, and thereby thinner printed circuit boards (PCB s) may provide space for additional functionalities in electronic devices. However, manufacturing thin fiber glass may not be feasible nor cost effective.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

As mentioned above, a printed circuit board (PCB) may have a number of metal and dielectric layers. In some embodiments, the metal layer may be composed of copper, aluminum, or any suitable metal. The dielectric layer may be non-conductive and serve as an electric insulator to prevent layer to layer shorts in the printed circuit board (PCB). Layer to layer shorts prevent electrical current from passing between components in the printed circuit board (PCB). For example, a dielectric layer, which may include resin impregnated fiber glass, may be disposed between two copper layers. Pre-impregnated (pre-preg) composite fibers or materials are made of a polymer matrix reinforced with glass fibers sheet and may be used to provide electrical insulation. However, thin sheets of fiber glass may be difficult to obtain or manufacture and may be expensive. Because manufacturing a thin dielectric layer, and thereby a thinner printed circuit board (PCB), may provide space for additional functionalities in electronic devices, improved features or techniques to manufacture a thin dielectric layer may be desirable to electronic device manufacturers.

Accordingly, the present disclosure provides techniques for manufacturing a thin dielectric layer. In particular, manufacturing a bilayer dielectric that is disposed between two metal layers (e.g., two copper layers) in the printed circuit board (PCB) may be cost effective, reduce thickness of the printed circuit board (PCB), and provide signal and power integrity (SIPI) benefits in an electronic device. By way of example, to manufacture a bilayer dielectric, a resin layer may be applied to a metal layer such as a copper substrate.

For example, after a resin layer is placed onto a copper layer, the resin layer may be fully cured to a C-stage layer in a clean environment. As used herein, resin is a solid or highly viscous substance that cures to a polymer. In this case, the resin is cured to the C-stage resin (e.g., epoxy) layer that is fully cured, hardened, or cross-linked. Because the resin layer is cured to the C-stage resin (e.g., epoxy) layer in a clean environment, the C-stage resin (e.g., epoxy) layer may be free of foreign material (e.g., dust particles, debris), which might otherwise serve as conductors through the resin (e.g., epoxy) layer. In turn, a B-stage resin (e.g., epoxy) layer may be placed onto the C-stage resin (e.g., epoxy) layer. The B-stage resin (e.g., epoxy) layer may be partially cured or partially cross-linked. Using a hot press or any suitable machine, copper traces or another copper layer may be pressed onto the B-stage resin (e.g., epoxy) layer. The combination of the C-stage resin (e.g., epoxy) layer and the B-stage resin (e.g., epoxy) layer may serve as the bilayer dielectric. The partially viscous properties of the B-stage resin (e.g., epoxy) layer may allow the B-stage resin (e.g., epoxy) to flow and fill in gaps formed between the C-stage resin (e.g., epoxy) layer and the copper traces. Additionally, the partially viscous and partially cured properties may allow the B-stage resin (e.g., epoxy) layer to efficiently adhere to the copper traces.

In some embodiments, unlike the C-stage resin (e.g., epoxy) layer, the B-stage resin (e.g., epoxy) layer may not be added to the C-stage resin (e.g., epoxy) layer in a clean environment. As a result, the B-stage resin (e.g., epoxy) layer may be susceptible to or may trap foreign material. Generally, foreign material trapped in the dielectric layer of the printed circuit board may cause layer to layer shorts. However, even if foreign material may have contaminated the B-stage resin (e.g., epoxy) layer, the C-stage resin (e.g., epoxy) layer may not be contaminated by foreign material and prevent issues in electrical conductivity between the copper substrate and traces of the printed circuit board (PCB). That is, because the C-stage resin (e.g., epoxy) layer has already been fully cured, the C-stage resin (e.g., epoxy) layer may provide electrical insulation and prevent layer to layer shorts in the printed circuit board (PCB). In some embodiments, foreign material may not be able to penetrate the C-stage resin layer due to the fully cured properties of the C-stage resin layer and being manufactured in a clean room environment. In other embodiments, compared to the C-stage resin layer, the likelihood of foreign contamination in the C-stage resin layer may be reduced.

In additional embodiments, the B-stage resin layer and the C-stage resin layer may be associated with different dielectric constants. Additionally, dielectric properties may be different between layers in the printed circuit board (PCB) compared to the dielectric properties between copper traces.

In some embodiments, the dielectric properties of both the C-stage and the B-stage resin layers may be adjusted to provide signal integrity and power integrity (SIPI) advantages.

Furthermore, the copper traces and the B-stage resin layer may be laminated, such that the B-stage resin layer may be fully cured and integrated with the C-stage resin layer. As such, the C-stage resin layer may define the thickness of the dielectric layer between the copper substrate and the copper traces. Unlike with material such as fiber glass, adjusting the thickness of the C-stage resin layer and subsequently the printed circuit board (PCB) may be adaptable and cost-effective. As a result, the bilayer dielectric may be manufactured to be thinner compared to other non-conductive layers (e.g., fiber glass based layer). In some embodiments, the bilayer dielectric may be less than 20 microns. Furthermore, the bilayer dielectric may not be limited to two resin layers (e.g., one C-stage resin layer and one B-stage resin layer). For example, the dielectric layer between the copper substrate and the copper traces in the printed circuit board (PCB) may include multiple C-stage resin layers and one B-stage resin layer, multiple C-stage resin layers and multiple B-stage resin layers, or multiple B-stage resin layers and one C-stage resin layers.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B.

Figure 1:
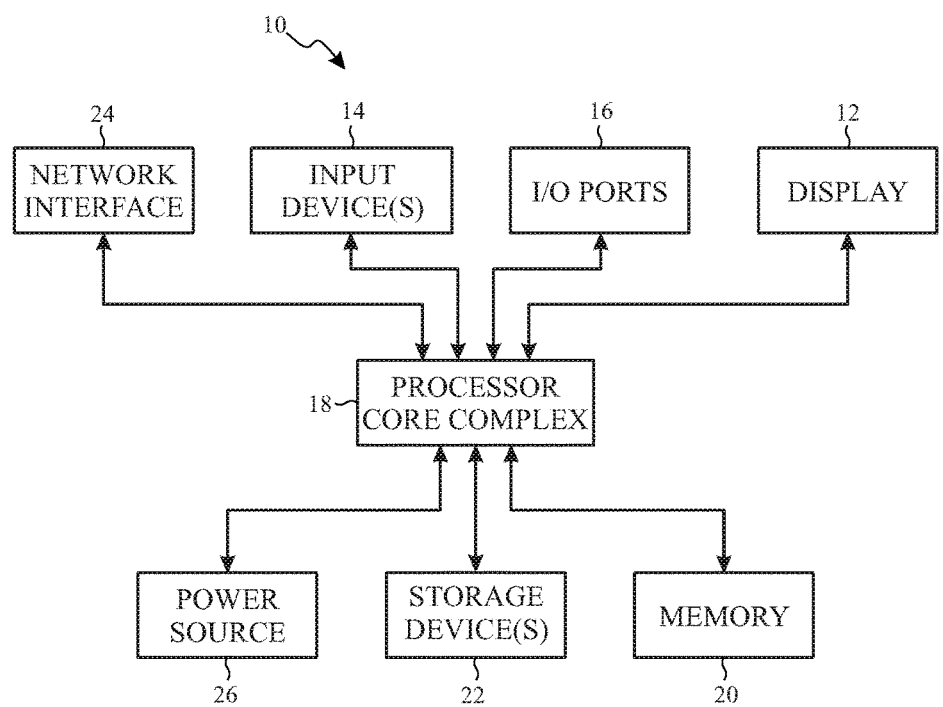
FIG. 1 is a block diagram of an electronic device with an electronic display, in accordance with an embodiment of the present disclosure.

With the preceding in mind and to help illustrate, an electronic device 10 including an electronic display 12 (e.g., display device) is shown in FIG. 1. As is described in more detail below, the electronic device 10 may be any suitable electronic device, such as a computer, a mobile phone, a portable media device, a tablet, a television, a virtual-reality headset, a vehicle dashboard, and the like. Thus, it should be noted that FIG. 1 is merely one example of a particular implementation and is intended to illustrate the types of components that may be present in an electronic device 10.

The electronic display 12 may be any suitable electronic display. For example, the electronic display 12 may include a self-emissive pixel array having an array of one or more of self-emissive pixels. The electronic display 12 may include any suitable circuitry to drive the self-emissive pixels, including for example row driver and/or column drivers (e.g., display drivers). Each of the self-emissive pixel may include any suitable light emitting element, such as an LED, one example of which is an OLED. However, any other suitable type of pixel, including non-self-emissive pixels (e.g., liquid crystal as used in liquid crystal displays (LCDs), digital micromirror devices (DMD) used in DMD displays) may also be used.

The electronic device 10 includes the electronic display 12, one or more input devices 14, one or more input/output (I/O) ports 16, a processor core complex 18 having one or more processor(s) or processor cores, local memory 20, a main memory storage device 22, a network interface 24, and a power source 26 (e.g., power supply). The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the local memory 20 and the main memory storage device 22 may be included in a single component.

The processor core complex 18 is operably coupled with local memory 20 and the main memory storage device 22. Thus, the processor core complex 18 may execute instruction stored in local memory 20 and/or the main memory storage device 22 to perform operations, such as generating and/or transmitting image data. As such, the processor core complex 18 may include one or more general purpose microprocessors, one or more application specific integrated circuits (ASICs), one or more field programmable logic arrays (FPGAs), or any combination thereof.

In addition to instructions, the local memory 20 and/or the main memory storage device 22 may store data to be processed by the processor core complex 18. Thus, the local memory 20 and/or the main memory storage device 22 may include one or more tangible, non-transitory, computer-readable mediums. For example, the local memory 20 may include random access memory (RAM) and the main memory storage device 22 may include read-only memory (ROM), rewritable non-volatile memory such as flash memory, hard drives, optical discs, and/or the like.

The network interface 24 may communicate data with another electronic device and/or a network. For example, the network interface 24 (e.g., a radio frequency system) may enable the electronic device 10 to communicatively couple to a personal area network (PAN), such as a Bluetooth network, a local area network (LAN), such as an 802.11x Wi-Fi network, and/or a wide area network (WAN), such as a 4G or Long-Term Evolution (LTE) cellular network. The power source 26 may provide electrical power to one or more components in the electronic device 10, such as the processor core complex 18 and/or the electronic display 12. Thus, the power source 26 may include any suitable source of energy, such as a rechargeable lithium polymer (Li-poly) battery and/or an alternating current (AC) power converter. The I/O ports 16 may enable the electronic device 10 to interface with other electronic devices. For example, when a portable storage device is connected, the I/O port 16 may enable the processor core complex 18 to communicate data with the portable storage device.

The input devices 14 may enable user interaction with the electronic device 10, for example, by receiving user inputs via a button, a keyboard, a mouse, a trackpad, and/or the like. The input device 14 may include touch-sensing components in the electronic display 12. The touch sensing components may receive user inputs by detecting occurrence and/or position of an object touching the surface of the electronic display 12.

In addition to enabling user inputs, the electronic display 12 may include a display panel with multiple display pixels. The electronic display 12 may control light emission from the display pixels to present visual representations of information, such as a graphical user interface (GUI) of an operating system, an application interface, a still image, or video content, by displaying frames based at least in part on corresponding image data. The electronic display 12 may display frames based at least in part on image data generated by the processor core complex 18. Additionally or alternatively, the electronic display 12 may display frames based at least in part on image data received via the network interface 24, an input device, and/or an I/O port 16.

Figure 2:
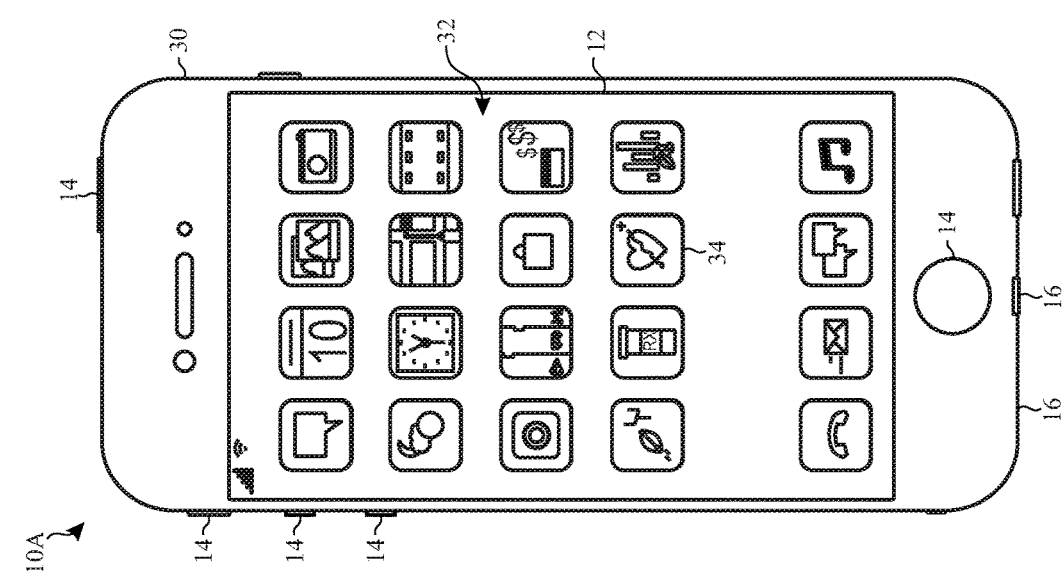
FIG. 2 is an example of the electronic device of FIG. 1, in accordance with an embodiment of the present disclosure.

The electronic device 10 may be any suitable electronic device. To help illustrate, an example of the electronic device 10, a handheld device 10A, is shown in FIG. 2. The handheld device 10A may be a portable phone, a media player, a personal data organizer, a handheld game platform, and/or the like. For illustrative purposes, the handheld device 10A may be a smart phone, such as any IPHONE® model available from Apple Inc.

The handheld device 10A includes an enclosure 30 (e.g., housing). The enclosure 30 may protect interior components from physical damage and/or shield them from electromagnetic interference, such as by surrounding the electronic display 12. The electronic display 12 may display a graphical user interface (GUI) 32 having an array of icons. When an icon 34 is selected either by an input device 14 or a touch-sensing component of the electronic display 12, an application program may launch.

The input devices 14 may be accessed through openings in the enclosure 30. The input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, and/or toggle between vibrate and ring modes.

Figure 3:
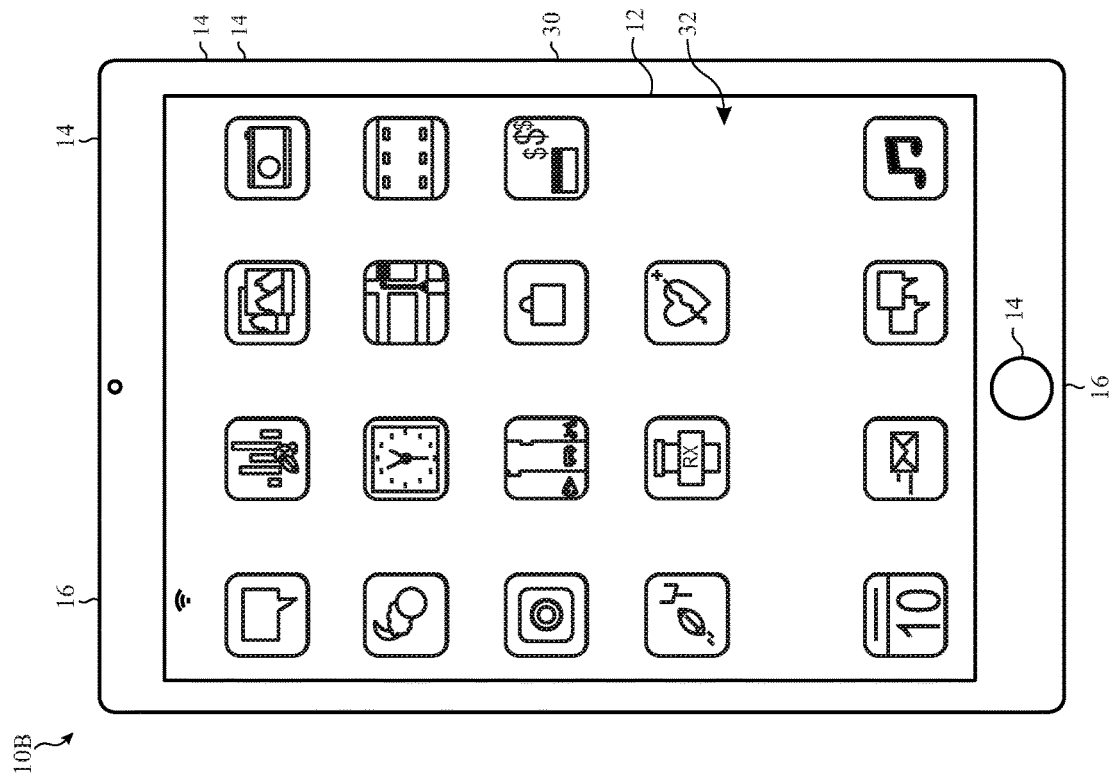
FIG. 3 is another example of the electronic device of FIG. 1, in accordance with an embodiment of the present disclosure.
Figure 4:
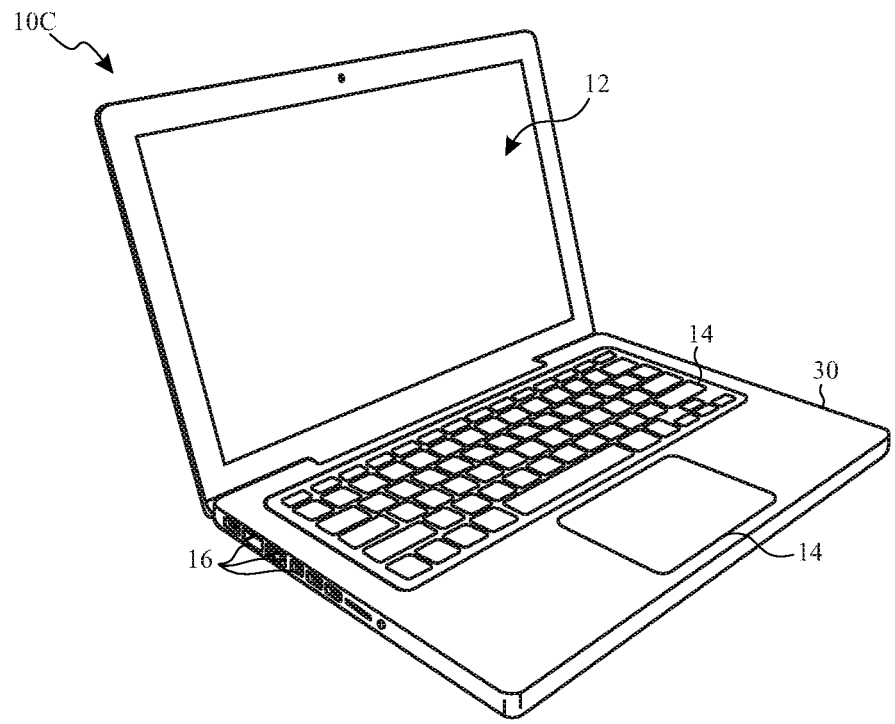
FIG. 4 is another example of the electronic device of FIG. 1, in accordance with an embodiment of the present disclosure.
Figure 5:
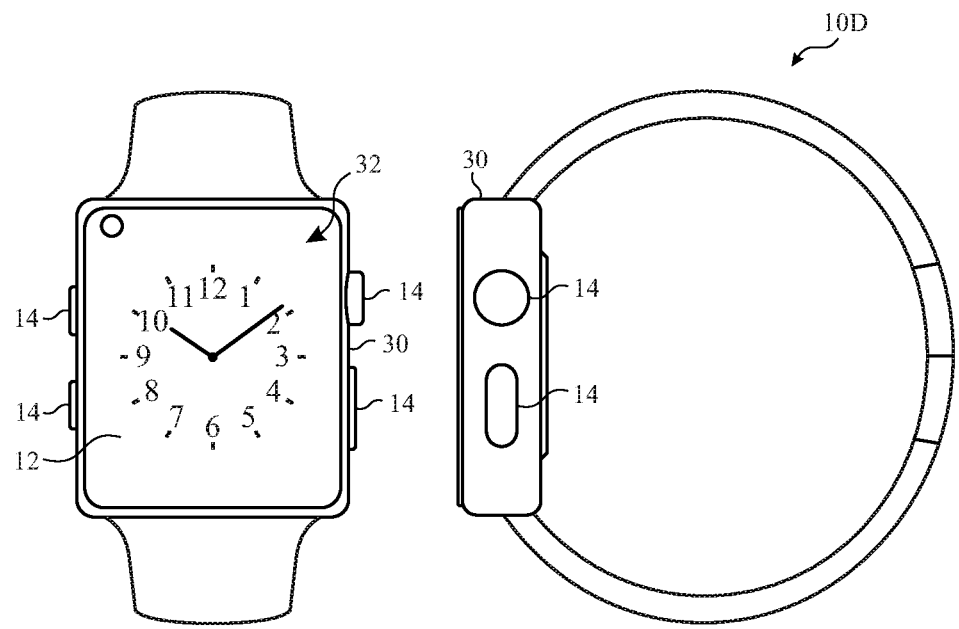
FIG. 5 is another example of the electronic device of FIG. 1, in accordance with an embodiment of the present disclosure.

Another example of a suitable electronic device 10, specifically a tablet device 10B, is shown in FIG. 3. The tablet device 10B may be any IPAD® model available from Apple Inc. A further example of a suitable electronic device 10, specifically a computer 10C, is shown in FIG. 4. For illustrative purposes, the computer 10C may be any MACBOOK® or IMAC® model available from Apple Inc. Another example of a suitable electronic device 10, specifically a watch 10D, is shown in FIG. 5. For illustrative purposes, the watch 10D may be any APPLE WATCH® model available from Apple Inc. As depicted, the tablet device 10B, the computer 10C, and the watch 10D each also includes an electronic display 12, input devices 14, I/O ports 16, and an enclosure 30. The electronic display 12 may display a GUI 32. Here, the GUI 32 shows a visualization of a clock. When the visualization is selected either by the input device 14 or a touch-sensing component of the electronic display 12, an application program may launch, such as to transition the GUI 32 to presenting the icons 34 discussed in FIGS. 2 and 3.

Figure 6:
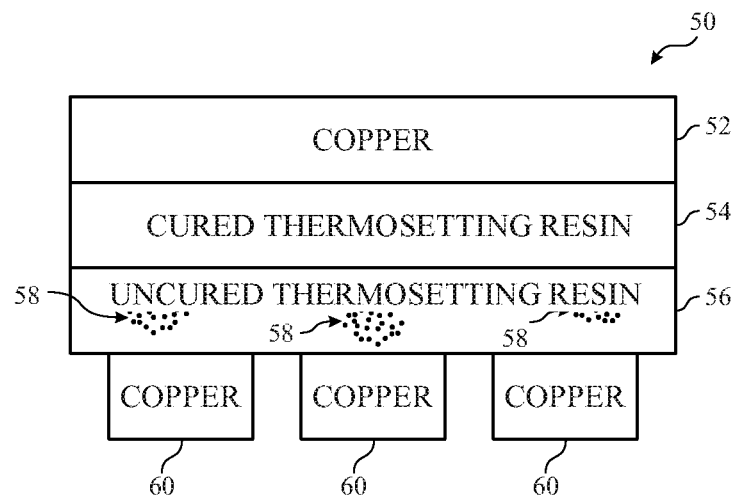
FIG. 6 is a block diagram of a printed circuit board (PCB) of the electronic device of FIG. 1 including a bilayer dielectric, in accordance with an embodiment of the present disclosure.

With the foregoing in mind, FIG. 6 is a block diagram of a printed circuit board (PCB) 50 of the electronic device 10 that includes a bilayer dielectric, in accordance with an embodiment of the present disclosure. As mentioned previously, the printed circuit board (PCB) 50 may include any number and type of layers (e.g., metal layers, dielectric layers). It should be noted that the printed circuit board (PCB) 50 is used as an example in FIG. 6. Manufacturing a thin bilayer dielectric may apply to any suitable multi-layered board or device.

In FIG. 6, the printed circuit board (PCB) 50 includes a bilayer dielectric in between two metal layers (e.g., copper substrate 52 and copper traces 60). The copper traces 60 serve as wires that route electrical signal between different components within the printed circuit board (PCB) 50. The copper substrate 52 and the copper traces 60 may be any suitable size, shape, and weight. Further, the copper substrate 52 and the copper traces 60 are examples of a metal layer and metal traces within the printed circuit board (PCB)

50. In some embodiments, the metal layer and metal traces may be composed of aluminum or any other suitable type of metal.

The bilayer dielectric serves to provide electrical isolation amongst metal components and prevent layer to layer shorts within the printed circuit board (PCB) 50. That is, the bilayer dielectric may insulate the copper traces 60 from accidental contact with other metal (e.g., copper substrate 52) that may lead to layer to layer shorts within the printed circuit board (PCB) 50. Further, the bilayer dielectric may serve as electrical insulation between one copper trace and another copper trace amongst the copper traces 60. Layer to layer shorts may inhibit electrical current from passing through components of the printed circuit board (PCB) 50. Severe consequences of accidental layer to layer shorts may include component damage or other damage.

In combination, C-stage resin layer 54 and B-stage resin layer 56 form the bilayer dielectric. The C-stage resin layer 54 may be fully cured or fully cross-linked while the B-stage resin layer 56 may be partially cured or partially cross-linked. A resin layer that is composed of a solid or highly viscous substance, may be converted to a fully cross-linked polymer via a curing process. In this example, the curing process may involve exposing the resin layer to heat, ultraviolet light, or high-energy radiation to be cured to a C-stage or a fully cross-linked polymer. In some embodiments, a curing agent may be mixed with the resin layer prior to the curing process. Therefore, via the curing process the resin layer is cured to the C-stage resin layer 54 that is fully cured, hardened, or cross-linked. The C-stage resin layer 54 may be cured in a clean room to reduce contamination from foreign material 58. As used herein, a clean room may be designed to maintain low levels of the foreign material 58, such as dust, airborne organisms, or vaporized particles compared to environments, in which air quality is not controlled. Low levels may include a range between 10 particles per cubic meter to 1,000 particles per cubic meter within air of the clean room.

The C-stage resin layer 54 and the B-stage resin layer 56 may include any suitable type of thermosetting resin such as epoxy, thermoplastic resin, and the like. Non-limiting examples of thermosetting resin include polyphenylene oxide-based resins, bismaleimide triazine-based resins, polyphenylene ether-based resins, polyimide-based resins. Further, non-limiting examples of thermoplastic resins include liquid crystalline polymer, polyether ether ketone.

Unlike the C-stage resin layer 54, the B-stage resin layer 56 is partially cured or partially cross-linked. As a result, the B-stage resin layer 56 is capable of flowing or moving within the bilayer dielectric due to its partially viscous properties. The B-stage resin layer 56 is applied to the C-stage resin layer 54. In some embodiments, the B-stage resin layer 56 may be manufactured or applied to the C-stage resin layer 54 in a clean room. In other embodiments, the B-stage resin layer 56 may not be manufactured or applied to the C-stage resin layer 54 in a clean room.

In particular, the B-stage resin layer 56 may be more susceptible to contamination from the foreign material 58 compared to the C-stage resin layer 54 due to the partially viscous nature of the B-stage resin layer 56 and/or the B-stage resin layer 56 not being manufactured within a clean room. For example, the B-stage resin may be manufactured in a room with air that has between 1,000 particles per cubic meter to 1,000,0000 particles per cubic meter to save clean room operational costs. Contamination from the foreign material 58 could contribute to layer-to-layer shorts within the printed circuit board (PCB) 50, but only if the contamination were present in both C-stage resin layer 54 and the B-stage resin layer 56. However, because the contamination may be unable to penetrate the already-cured C-stage resin layer 54, the contamination may be limited to the B-stage resin layer 56.

Indeed, the foreign material 58 may not be able to penetrate the C-stage resin layer 54 due to the fully cured properties of the C-stage resin layer 54 and being manufactured in a clean room. Therefore, even if the foreign material 58 may have contaminated the B-stage resin layer 56, the C-stage resin layer 54 may prevent issues in electrical conductivity amongst the copper substrate 52 and the copper traces 60 and prevent layer to layer shorts in the printed circuit board (PCB) 50. That is, because the C-stage resin layer 54 has already been fully cured, the C-stage resin layer 54 may be less susceptible to the foreign material 58 compared to the B-stage resin layer 56. Thus, the C-stage resin layer 54 may be capable of providing electrical isolation and preventing layer to layer shorts in the printed circuit board (PCB) 50. The likelihood of foreign contamination in the C-stage resin layer 54 may be reduced compared to the B-stage resin layer 56. Acceptable levels of contamination from the foreign material 58 may vary in the C-stage resin layer 54 and the B-stage resin layer 56. The C-stage resin layer 54 may include a first rate of contamination by conductive materials that is less than 1000 conductive materials per cubic meter. The B-stage resin layer 56 may be associated with a second rate of contamination by conductive materials that is greater than or equal to 1000 conductive materials per cubic meter.

It should be noted that the C-stage resin layer 54 and B-stage resin layer 56 are examples of non-conductive layers that may form the bilayer dielectric. In some embodiments, the bilayer dielectric may be formed based on the C-stage resin layer 54 and an A-stage resin layer instead of the B-stage resin layer 56. The level of cross-linking in the A-stage resin layer is lower compared to the B-stage resin layer 56. Thus, the A-stage resin layer is less cured and more viscous compared to the B-stage resin layer 56.

In some embodiments, the dielectric layer between the copper substrate 52 and copper traces 60 may be tri-layered or any suitable number of layers. For example, the dielectric layer may include any number of C-stage resin layers 54 or fully cross-linked layers and a single B-stage resin layer 56 or a partially cross-linked layer. Because the C-stage resin layer 54 is less susceptible to contamination from the foreign material compared to the B-stage resin layer, the dielectric layer may include multiple layers of the C-stage resin but one layer of the B-stage resin. Rather than having a dielectric layer with only C-stage resin layers 54, a B-stage resin layer 56 is included as well.

Figure 7:
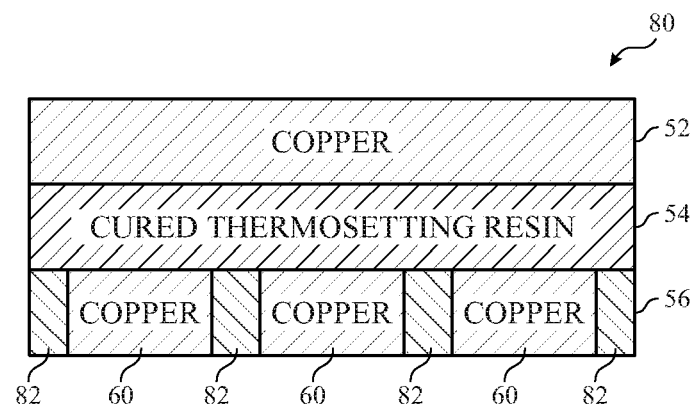
FIG. 7 is a block diagram depicting metal traces pressed into an uncured portion of the bilayer dielectric of FIG. 1, in accordance with an embodiment of the present disclosure.

After the B-stage resin layer 56 has been applied to the C-stage resin layer 54, a copper layer or the copper traces 60 are pressed into the B-stage resin layer 56. As such, FIG. 7 is a block diagram depicting a manufacturing stage 80 of the printed circuit board (PCB) 50 when copper traces 60 have been pressed into the B-stage resin layer 56 of the bilayer dielectric, in accordance with an embodiment of the present disclosure. The copper traces 60 may be pressed into the B-stage resin layer 56 via a hot press or any suitable machine (e.g., lamination machine). The hot press may involve applying pressure at a suitable level to squeeze out air when pressing the copper traces 60 onto B-stage resin layer 56. Simultaneously, when applying pressure to press in the copper traces 60, heat at a suitable temperature (e.g., 170-220° C.) may be applied to help the copper traces 60 adhere to the B-stage resin layer 56. The hot press operates at pressure and/or temperature ranges that allow the B-stage resin layer 56 to become soft such that the B-stage resin layer 56 may flow and fill in the spaces between the copper traces 60. Further, the C-stage resin layer 54 may serve as a stopper and would not flow by the application of heat and pressure since the C-stage resin layer 54 is already cured.

Rather than having a dielectric layer composed only of C-stage resin layers 54, the B-stage resin layer 56 is included due to the viscous properties of the B-stage resin layer 56 that are beneficial when manufacturing the bilayer dielectric. As indicated, in the block diagram depicting the manufacturing stage 80 of the printed circuit board (PCB) 50, one or more gaps 82 may form between the C-stage resin layer 54 and the copper traces 60. Due to its partially viscous properties, the B-stage resin layer 56 is capable of flowing and filling in the one or more gaps 82 unlike the C-stage resin layer 54. Further, the B-stage resin layer 56 adheres to metal such as the copper traces 60 more efficiently compared to the C-stage resin layer 54. Therefore, the bilayer dielectric may include at least one non-conductive layer (e.g., the B-stage resin layer 56) that is partially cross-linked, and thereby partially viscous.

Figure 8:
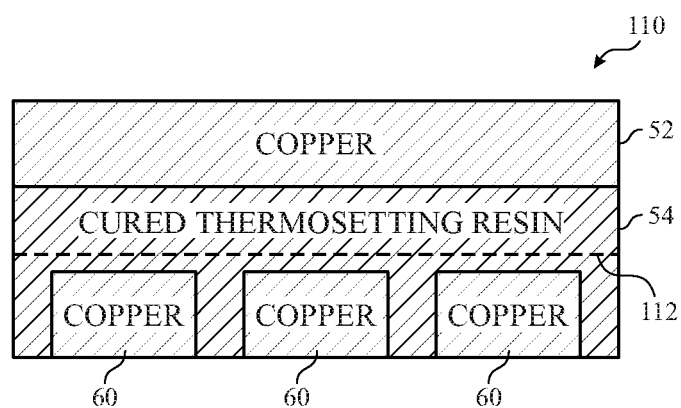
FIG. 8 is a block diagram depicting the uncured portion laminated and integrated with a cured portion of the bilayer dielectric of FIG. 1, in accordance with an embodiment of the present disclosure.

After the copper traces 60 have been pressed into the B-stage resin layer 56, the B-stage resin layer with the pressed-in copper traces 60 undergoes a lamination process. As such, FIG. 8 is a block diagram depicting a manufacturing stage 110 of the printed circuit board (PCB) 50 when the B-stage resin layer 56 has been laminated and integrated with C-stage epoxy layer 54 of the bilayer dielectric, in accordance with an embodiment of the present disclosure. As used herein, the lamination process involves using heat and/or pressure to permanently adhere two or more layer together via a hot press, lamination machine, or any suitable machine. In process of lamination such that the copper traces 60 have adhered to the B-stage resin layer 56, the B-stage resin layer 56 is cured to a C-stage or fully cross-linked, and thus may be integrated and may adhere to the C-stage resin layer 54. Even though the B-stage resin layer 56 has been cured to become the C-stage resin layer 54, dielectric properties may vary across the dielectric bilayer. That is, as shown in the block diagram, a portion above the dashed line 112 may have a different dielectric constant that another portion below the dashed line 112. The portion above the dashed line 112 depicts the original C-stage resin layer 54 while the portion below the dashed line 112 represents the B-stage resin layer 56 that has been converted to the C-stage resin layer 54 via the lamination process.

The B-stage resin layer 56, which is subsequently transformed into the C-stage resin layer 54 via the lamination process, may have a different dielectric constant and dissipation factor compared to the C-stage resin layer 54. As used herein, the dielectric constant is a measure of the amount of electric potential energy stored by an electrical insulator such as the B-stage resin layer 56 and the C-stage resin layer 54. Whereas, the dissipation factor refers to a rate of loss of electrical potential energy by the B-stage resin layer 56 and the C-stage resin layer 54. In some embodiments, the rate of curing of different portions of the dielectric bilayer (the B-stage resin layer 56 and the C-stage resin layer 54) may be adjusted to control the dielectric properties associated with the different portions of the dielectric bilayer. Varying dielectric properties may affect the signal integrity and power integrity (SIPI) across the printed circuit board (PCB) 50. As such, the rate of curing and the extent to which different portions of the dielectric bilayer are cross-linked (e.g., cross-linking rate for the B-stage resin layer 56 and the C-stage resin layer 54 may vary) may be adjusted to control corresponding dielectric and mechanical properties, and thereby adjust (e.g., improve) the signal integrity and power integrity (SIPI) across the printed circuit board (PCB) 50. Mechanical properties may include Young's modulus, stiffness, toughness, fracture rate, and the like.

Further, since the B-stage resin layer 56 has been cured to be fully cross-linked and integrated with the C-stage resin layer 54, the C-stage resin layer 54 may define the thickness associated with the bilayer dielectric disposed between the copper substrate 52 and the copper traces 60. Unlike techniques that manufacture a dielectric layer using fiber glass and resin, the thickness of the bilayer dielectric may be adjusted effectively without incurring increased expenses. The size and shape of each layer and the number of layers within the dielectric layer may be adjusted to control the thickness of the dielectric layer between the copper substrate 52 and the copper traces 60. Manufacturing a thin dielectric layer results in the printed circuit board (PCB) 50 being thin as well. Because the thin printed circuit board (PCB) 50 may provide space for additional functionalities in electronic devices 10, improved features or techniques to manufacture a thin dielectric layer may be desirable to electronic device manufacturers.

Figure 9:
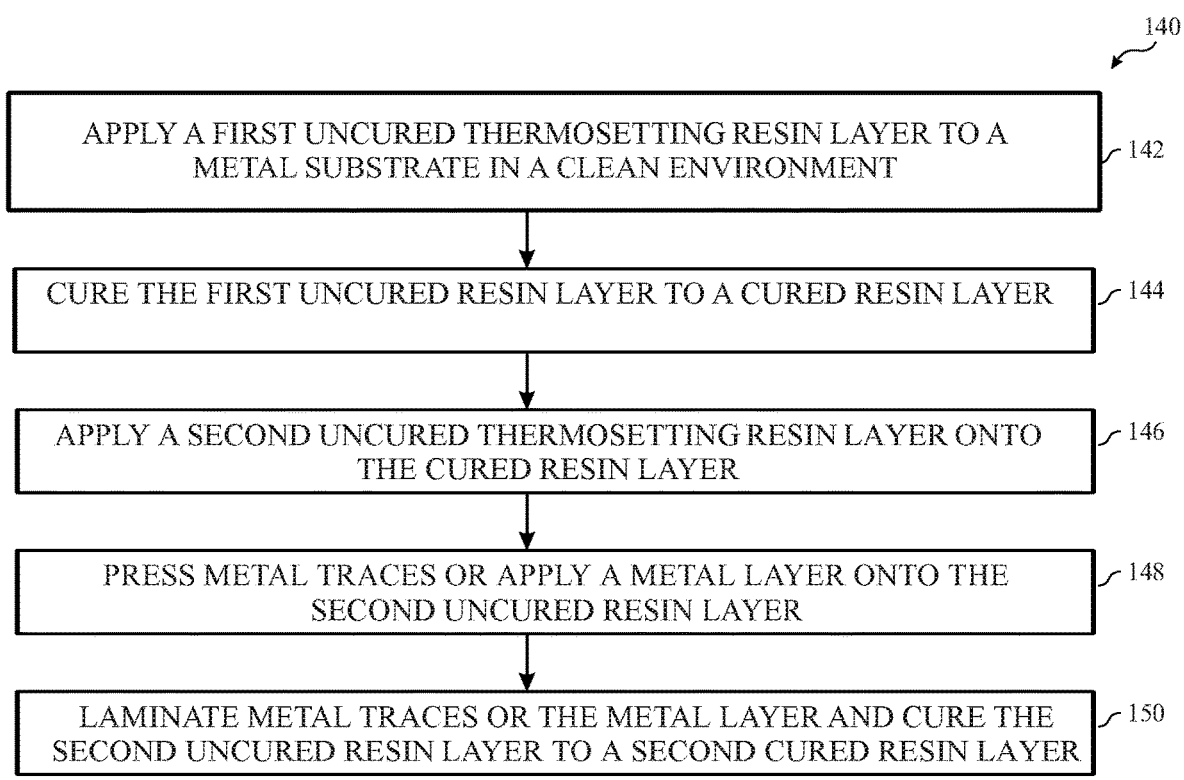
FIG. 9 is a flow diagram of a process for manufacturing a bilayer dielectric of FIG. 1, in accordance with an embodiment of the present disclosure.

For example, a dielectric layer that is less than 20 microns may be manufactured using the process 140 described in FIG. 9. As such, FIG. 9 is a flow diagram of the process 140 for manufacturing a bilayer dielectric of FIG. 6, in accordance with an embodiment of the present disclosure. While the process 140 is described using steps in a specific sequence, it should be understood that the present disclosure contemplates that the described steps may be performed in different sequences than the sequence illustrated, and certain described steps may be skipped or not performed altogether.

In order to manufacture dielectric bilayer with a configurable thickness, a first resin layer is applied to a metal substrate such as a copper substrate (block 142). The first resin layer is cured to a C-stage resin layer (e.g., first C-stage epoxy layer) via a curing process or lamination process (block 144). As mentioned above, a resin layer that is composed of a solid or highly viscous substance, may be converted to a fully cross-linked polymer via a curing process. In this example, the curing process may involve exposing the resin layer, which is attached to the metal substrate, to heat, ultraviolet light, or high-energy radiation to be cured to a C-stage or a fully cross-linked polymer. In some embodiments, a curing agent may be mixed with the resin layer prior to the curing process. Therefore, via the curing process the resin layer is cured to the C-stage resin layer (e.g., a C-stage epoxy layer) that is fully cured, hardened, or cross-linked. The C-stage resin layer (e.g., first C-stage epoxy layer) may be cured in a clean room to reduce contamination from foreign material. The curing process or the lamination process may help attach the C-stage resin layer to the metal substrate.

After the first resin layer has become fully cross-linked and is permanently attached to the metal substrate, a B-stage resin layer is applied to the first C-stage resin layer (block 146). Unlike the first C-stage resin layer, the B-stage resin layer may be partially cured or partially cross-linked. Therefore, due to its partially viscous properties, the B-stage resin layer may be susceptible to contamination from foreign materials. However, even if foreign material may have contaminated the B-stage resin layer, the first C-stage resin layer prevent layer to layer shorts in the printed circuit board (PCB) 50. That is, because the first C-stage resin layer has already been fully cured, the first C-stage resin layer may be less susceptible to the foreign material compared to the B-stage resin layer. In combination, the B-stage resin layer and the first C-stage resin layer form a dielectric layer or an electrically insulated substrate that provides electrical isolation between the metal substrate and the metal traces.

In turn, metal traces (e.g., copper traces) or a metal layer (e.g., copper layer) is pressed into the B-stage resin layer via a hot press (block 148). The metal traces or the metal layer are permanently bonded to the B-stage resin layer in a lamination process. During the lamination process, the B-stage resin layer is cured to a C-stage resin (e.g., second C-stage epoxy layer) and integrated with the first C-stage resin layer (block 150) as described above. As such, the C-stage resin layer (the first C-stage resin layer more so than the second C-stage resin layer) may define the thickness of the dielectric layer between the copper substrate and the copper traces, since the viscous B-stage resin layer may be pressed around the metal traces or metal layer before it has been cured while the already-cured first C-stage resin layer does not substantially change shape when pressed because it is no longer a viscous fluid. Yet unlike materials such as fiber glass, adjusting the thickness of the C-stage resin layer and subsequently the printed circuit board (PCB) may be adaptable and cost-effective. As a result, the bilayer dielectric may be manufactured to be thinner compared to many other non-conductive layers (e.g., fiber glass based layer). As described above, the first C-stage resin layer and the second C-stage resin layer may include any suitable type of resin such as epoxy, thermosetting resin, thermoplastic resin, or the like.

In sum, manufacturing a multi-layered board such as a printed circuit board may involve applying a first non-conductive layer (e.g., C-stage resin layer) to a metal substrate (e.g., copper substrate). The first non-conductive layer may be cured to a fully cross-linked layer in a clean environment. A second non-conductive layer (e.g., B-stage resin layer) that is partially cross-linked may be applied to the fully cross-linked layer in a non-clean environment. The second non-conductive layer may be cured in the non-clean environment after being applied to the fully cross-linked layer. In turn, one or more metal traces (e.g., copper traces) may be pressed onto the second non-conductive layer via a hot press. The one or more metal traces and the second non-conductive layer may be also be laminated via the hot press or a lamination machine. In response to laminating the one or more metal traces and the second non-conductive layer, the second non-conductive layer may be fully cross-linked and integrated with the fully cross-linked layer.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A multi-layered board, comprising:
a copper substrate; and
a bilayer dielectric, wherein the bilayer dielectric comprises:
a C-stage epoxy layer, wherein the C-stage epoxy layer is fully cross-linked and coupled to the copper substrate, wherein the C-stage epoxy layer comprises an amount of contamination of 1000 conductive materials per cubic meter or less; and
a B-stage epoxy layer, wherein the B-stage epoxy layer is partially cross-linked, wherein the B-stage epoxy layer is configured to transform into the C-stage epoxy layer via lamination of the B-stage epoxy layer and one or more copper traces, wherein the lamination comprises the B-stage epoxy layer being coupled to the one or more copper traces, and wherein the C-stage epoxy layer has a lower amount of contamination than the B-stage epoxy layer.

2. The multi-layered board of claim 1, wherein the C-stage epoxy layer defines a thickness of the bilayer dielectric between the copper substrate and the one or more copper traces.

3. The multi-layered board of claim 1, wherein the C-stage epoxy layer and the B-stage epoxy layer differ with respect to one or more dielectric properties, one or more mechanical properties, or both.

4. The multi-layered board of claim 3, wherein the one or more dielectric properties, the one or more mechanical properties, or both are configurable based on adjusting a cross-linking rate of different portions of the bilayer dielectric.

5. The multi-layered board of claim 1, wherein the multi-layered board comprises a printed circuit board (PCB).

6. The multi-layered board of claim 1, wherein the bilayer dielectric is configured to provide electrical isolation between the copper substrate and the one or more copper traces.

7. The multi-layered board of claim 1, wherein the B-stage epoxy layer fills in one or more gaps formed between the C-stage epoxy layer and the one or more copper traces.

8. The multi-layered board of claim 1, wherein the C-stage epoxy layer provides electrical isolation despite contamination from foreign material in the B-stage epoxy layer.

9. The multi-layered board of claim 1, wherein a total thickness of the C-stage epoxy layer and the B-stage epoxy is 20 µm or less.

10. A printed circuit board, comprising:
a metal substrate; and
an electrically insulated substrate, wherein the electrically insulated substrate comprises:
a first non-conductive layer configured to be a fully cross-linked layer and coupled to the metal substrate, wherein the first non-conductive layer comprises a first contamination rate less than 1000 conductive materials per cubic meter;
a second non-conductive layer coupled to the fully cross-linked layer, wherein the second non-conductive layer is partially cross-linked and comprises a second contamination rate greater than 1000 conductive materials per cubic meter; and
one or more metal traces configured to couple the second non-conductive layer via a lamination process.

11. The printed circuit board of claim 10, wherein the fully cross-linked layer comprises a C-stage epoxy layer, and wherein the second non-conductive layer comprises a B-stage epoxy layer.

12. The printed circuit board of claim 10, wherein the metal substrate comprises a copper substrate, and wherein the one or more metal traces comprise one or more copper traces.

13. The printed circuit board of claim 10, wherein the fully cross-linked layer and the second non-conductive layer form a bilayer dielectric.

14. The printed circuit board of claim 13, wherein the bilayer dielectric is disposed between the metal substrate and the one or more metal traces, and wherein the fully cross-linked layer defines a thickness of the bilayer dielectric between the metal substrate and the one or more metal traces.

15. The printed circuit board of claim 13, wherein the bilayer dielectric provides electrical isolation between the metal substrate and the one or more metal traces.

16. The printed circuit board of claim 10, wherein the fully cross-linked layer differs in dielectric constant from the second non-conductive layer.

17. The printed circuit board of claim 10, wherein the one or more metal traces and the second non-conductive layer are configured to be laminated in the lamination process such that the second non-conductive layer is fully cross-linked and integrated with the fully cross-linked layer.

18. The printed circuit board of claim 10, wherein the second non-conductive layer has a higher rate of contamination than the first non-conductive layer when the second non-conductive layer is coupled to the fully cross-linked layer using the lamination process in a non-clean environment.

19. A system, comprising:
a metal substrate; and
an electrically insulated substrate, wherein the electrically insulated substrate comprises:
a first C-stage resin layer fully cross-linked and coupled to the metal substrate, wherein the first C-stage resin layer comprises a first rate of contamination by conductive materials, wherein the first rate of contamination by conductive materials comprises less than 1000 conductive material per cubic meter; and
a second C-stage resin layer fully cross-linked and coupled to the first C-stage resin layer, wherein the second C-stage resin layer comprises a second rate of contamination by conductive materials greater than 1000 conductive materials per cubic meter; and
one or more copper traces coupled to the second C-stage resin layer via a lamination.

20. The system of claim 19, wherein the electrically insulated substrate comprises a third C-stage resin layer.

21. The system of claim 19, wherein the first C-stage resin layer and the second C-stage resin layer are configured to differ in one or more dielectric properties, one or more mechanical properties, or both.

22. The system of claim 19, wherein the system comprises a computer, a handheld device, a portable phone, a wearable device, a watch, or any combination thereof, having a thickness that is defined at least in part on a thickness of the electrically insulated substrate.

23. The system of claim 19, wherein the first C-stage resin layer and the second C-stage resin layer comprise one or more thermosetting resins, wherein the one or more thermosetting resins comprise one or more polyphenylene oxide-based resins, one or more bismaleimide triazine-based resins, one or more polyphenylene ether-based resins, one or more polyimide-based resins, or any combination thereof.

24. The system of claim 19, wherein the first C-stage resin layer and the second C-stage resin layer comprise one or more thermoplastic resins, wherein the one or more thermoplastic resins comprise one or more liquid crystalline polymers, polyether ether ketone resins, or both.

25. A multi-layered board, comprising:
a copper substrate; and
a bilayer dielectric, wherein the bilayer dielectric comprises:
a first C-stage epoxy layer, wherein the C-stage epoxy layer is fully cross-linked and coupled to the copper substrate; and
a second C-stage epoxy layer, wherein the second C-stage epoxy layer is fully cross-linked, wherein the second C-stage epoxy layer is configured to transform into the second C-stage epoxy layer via lamination of a B-stage epoxy layer and one or more copper traces, and wherein the lamination comprises the second C-stage epoxy layer being coupled to the one or more copper traces, wherein the second C-stage epoxy layer has an amount of contamination greater than 1000 conductive materials per cubic meter, and wherein the first C-stage epoxy layer has a lower amount of contamination than the second C-stage epoxy layer.

26. The multi-layered board of claim 25, wherein the multi-layered board comprises a printed circuit board (PCB).

27. The multi-layered board of claim 25, wherein the first C-stage epoxy layer provides electrical isolation despite contamination from foreign material in the second C-stage epoxy layer.

28. The multi-layered board of claim 25, wherein a total thickness of the first C-stage epoxy layer and the second C-stage epoxy is 20 µm or less.

29. The multi-layered board of claim 25, wherein one or more first dielectric properties of the first C-stage epoxy layer are different than one or more second dielectric properties of the second C-stage epoxy layer.

* * * * *